United States Patent
Rennick

(10) Patent No.: US 6,522,204 B1
(45) Date of Patent: Feb. 18, 2003

(54) PHASE-LOCKED LOOP FOR ADSL FREQUENCY LOCKING APPLICATIONS

(75) Inventor: Lyle V. Rennick, Cupertino, CA (US)

(73) Assignee: Texas Instruments Incorporated, Dallas, TX (US)

(*) Notice: Subject to any disclaimer, the term of this patent is extended or adjusted under 35 U.S.C. 154(b) by 126 days.

(21) Appl. No.: 09/723,574

(22) Filed: Nov. 28, 2000

(51) Int. Cl.[7] .................................................. H03L 7/06
(52) U.S. Cl. ..................... 331/1 A; 331/17; 331/25; 327/157; 327/159; 375/376; 375/374
(58) Field of Search ................................ 331/1 A, 158, 331/116 R, 17; 375/376, 374; 327/157, 159, 160

(56) References Cited

U.S. PATENT DOCUMENTS 6,223,061 B1 * 4/2001 Dacus et al. ................ 455/574
6,369,624 B1 * 4/2002 Wang et al. ................. 327/156

OTHER PUBLICATIONS

Datasheet for "ICS73–01, PLL Building Block," Integrated Circuit Systems, Inc., Apr. 11, 2000.

* cited by examiner

Primary Examiner—Arnold Kinkead
(74) Attorney, Agent, or Firm—Pedro P. Hernandez; W. James Brady, III; Frederick J. Telecky, Jr.

(57) ABSTRACT

A phase-locked loop (PLL), particularly useful for ADSL frequency locking applications, uses inexpensive external components in combination with versatile logic that can be implemented in a programmable logic device or an application specific integrated circuit. The PLL has the ability to revert to center-frequency operation in the absence of a timing reference and to adapt to a variety of reference frequencies through logic selection.

17 Claims, 6 Drawing Sheets

PHASE-LOCKED LOOP FOR ADSL FREQUENCY LOCKING APPLICATIONS

BACKGROUND OF THE INVENTION

1. Field of the Invention

This invention relates generally to phase-locked loops, and more particularly to a phase-locked loop using a voltage controlled crystal oscillator (VCXO) driven by logic in a programmable logic device (PLD) or application specific integrated circuit (ASIC) for ADSL frequency locking applications.

2. Description of the Prior Art

Phase-locked loops are commonly used in radio communications equipment, modem signal generators, and ADSL applications, among others. A phase-locked loop (PLL) consists generally of three parts: a reference frequency input portion, a loop filter portion, and a voltage-controlled oscillator (VCO) portion. The reference frequency portion includes a phase comparator and sometimes also includes a frequency divider. The phase comparator compares an output signal of the PLL with either a reference frequency or a reference frequency divided down, to produce an error signal. The error signal is filtered via the loop filter to produce a control signal that is applied to the VCO. During proper operation, the control signal drives the VCO in the proper direction so as to cause the error signal to be driven to zero or nearly zero. Modern PLL's are most commonly realized in the form of integrated circuits. As such, costs associated with modern PLL's have continued to increase and the performance characteristics associated with these modern PLL's have remained static in that these integrated circuits do not have the ability to adapt to a variety of reference frequencies and the like.

In view of the foregoing, a need exists for a cost effective PLL architecture that offers greater flexibility than that presently provided by packaged PLL's, for example, to adapt to a variety of reference frequencies, including reversion to center-frequency operation in the absence of a timing reference. Such a PLL would be particularly advantageous for ADSL frequency locking applications.

SUMMARY OF THE INVENTION

The present invention is directed to phase-locked loop for ADSL frequency locking applications. Specifically, a PLL is implemented for locking a voltage-controlled crystal oscillator to a low frequency reference clock. One application of the PLL includes locking an ADSL system clock to a network timing reference or to a voice PCM clock.

According to one embodiment, a PLL architecture uses a divider and phase comparator implemented along with other control logic in a small PLD and that is responsive to a low frequency reference, a charge pump filter, and a voltage-controlled crystal oscillator (VCXO) that is driven via the filtered output of the PLD. The low frequency reference is also called the network timing reference (NTR), although this input could also be another reference, such as the clock used for a PCM voice connection. The PLD produces a single tristated pulsed output. In closed-loop operation, this output consists of narrow logic high or low pulses in the vicinity of the positive edge of the NTR that keep the loop filter charged to the proper control voltage through a series resistor for frequency and phase lock. During most of each NTR cycle when pulses are not being generated, the PLD output is in a tristate condition, allowing the control voltage to maintain a nearly constant d-c voltage (since the input impedance of the VCXO is extremely high). In open-loop operation, the PLD output toggles continually between a logic high and low state at a duty cycle that maintains a nominal mid-range control voltage so that the VCXO will operate near its center frequency. Logic in the PLD selects closed-loop operation automatically when the NTR input is detected, and reverts to open-loop operation when NTR is not detected.

In one aspect of the invention, a PLL is implemented that offers considerable cost advantages over commercially available packaged PLL's suitable for use in clocked oscillator (CO) linecard designs.

In another aspect of the invention, a PLL is implemented that provides a great deal of flexibility for tuning the PLL to the jitter characteristics associated with a particular NTR or PCM clock source by making various digital timing parameters, as well as analog filter components easily accessible.

In yet another aspect of the invention, a PLL is implemented such that the PLL falls back to a midrange, rather than a minimum, operating frequency in the absence of a reference input to avoid the necessity of making a hardware selection that is dependent upon whether an NTR source is or is not connected.

In still another aspect of the invention, a PLL is implemented having control circuitry in digital form suitable for implementation in an ASIC.

In still another aspect of the invention, a PLL is implemented that provides for acceleration of the frequency capture time and the phase capture time over PLL's using conventional analog architectures.

In still another aspect of the invention, a PLL is implemented that has lock-in times compatible with the power-on train time of ADSL modems.

BRIEF DESCRIPTION OF THE DRAWINGS

Other aspects and features of the present invention, and many of the attendant advantages of the present invention, will be readily appreciated as the same become better understood by reference to the following detailed description when considered in connection with the accompanying drawing wherein.

While the above-identified drawing figures exemplify characteristics associated with particular embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

Figure 1:
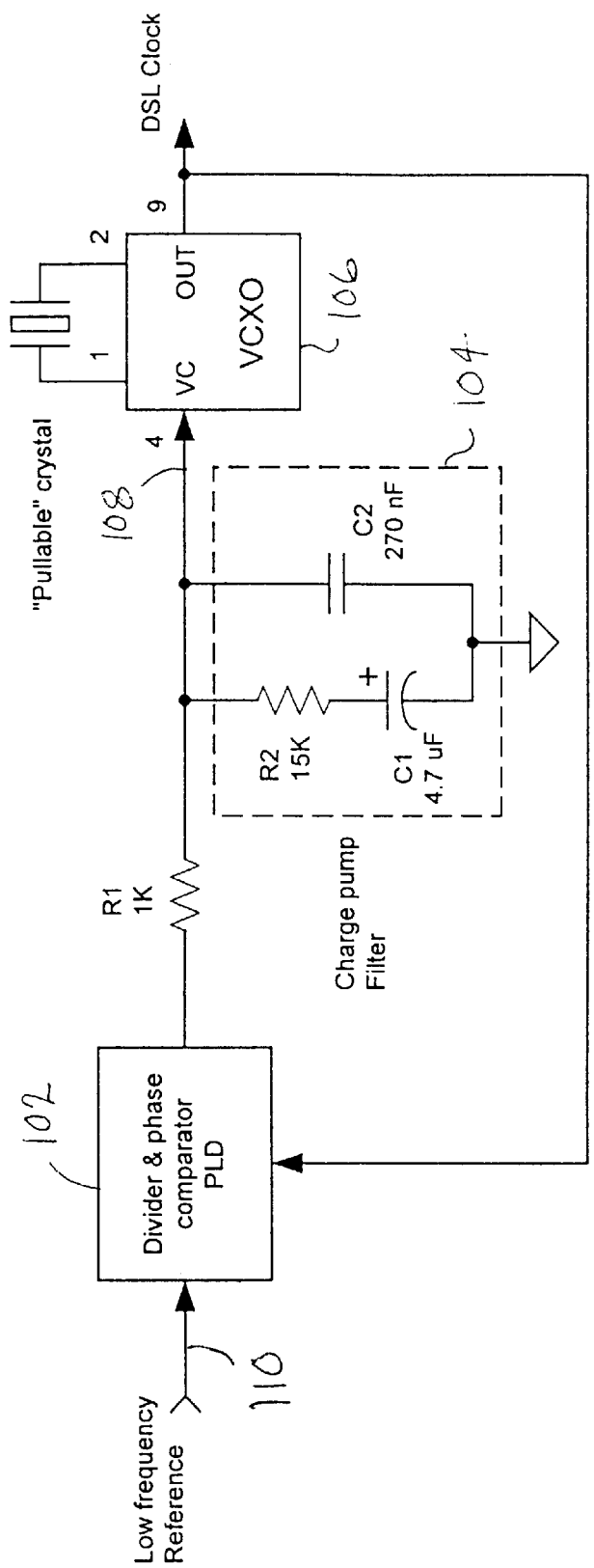
FIG. 1 is a simplified block diagram depicting a PLL having a PLD, a charge pump filter and a VCXO according to one embodiment of the present invention.

FIG. 1 is a simplified block diagram depicting a PLL 100 having a PLD 102, a charge pump filter 104 and a VCXO 106 according to one embodiment of the present invention. One VCXO 106 suitable for use with the PLL 100 to produce, for example, a 35.328 MHz clock is a model MK2731-04S VCXO commercially available from ICS MicroClock of San Jose, Calif. This part uses an intermediate frequency (13.248 MHz) "pullable" crystal with internal PLL circuitry to create the 35.328 MHz output. The control voltage at the VC input 108 pulls the output frequency by +/−100 PPM with a linear transfer function of approximately 100 PPM/volt over the range of 0–2 volts. The combination of the MK2731-04S plus the crystal results in a frequency control element at less than half the cost of typical packaged VCXOs. It can be appreciated that similar parts are available for other output frequencies, including for example, 70.656 MHz.

With continued reference now to FIG. 1, a frequency divider, phase comparator, and other control logic are contained in a small PLD 102. Herein after, the low frequency reference input 110 shall be referred to as NTR (Network Timing Reference), although this input 110 could also be another reference, such as the clock used for a PCM voice connection. The PLD 102 produces a single tristated pulsed output. In closed-loop operation, this output consists of narrow logic high or low pulses in the vicinity of the positive edge of the NTR 110 that keep the loop filter 104 charged to the proper control voltage through resistor R1 for frequency and phase lock. During most of each NTR 110 cycle when pulses are not being generated, the PLD 102 output is in a tristate condition, allowing the control voltage to maintain a nearly constant d-c voltage (since the input impedance of the VCXO 106 is extremely high). In open-loop operation, the PLD 102 output toggles continuously between a logic high state and low state at a duty cycle that maintains a nominal mid-range control voltage so that the VCXO 106 will operate near its center frequency. Logic in the PLD 102 selects closed-loop operation automatically when the NTR input 110 is detected, and reverts to open-loop operation when it is not.

Figure 2:
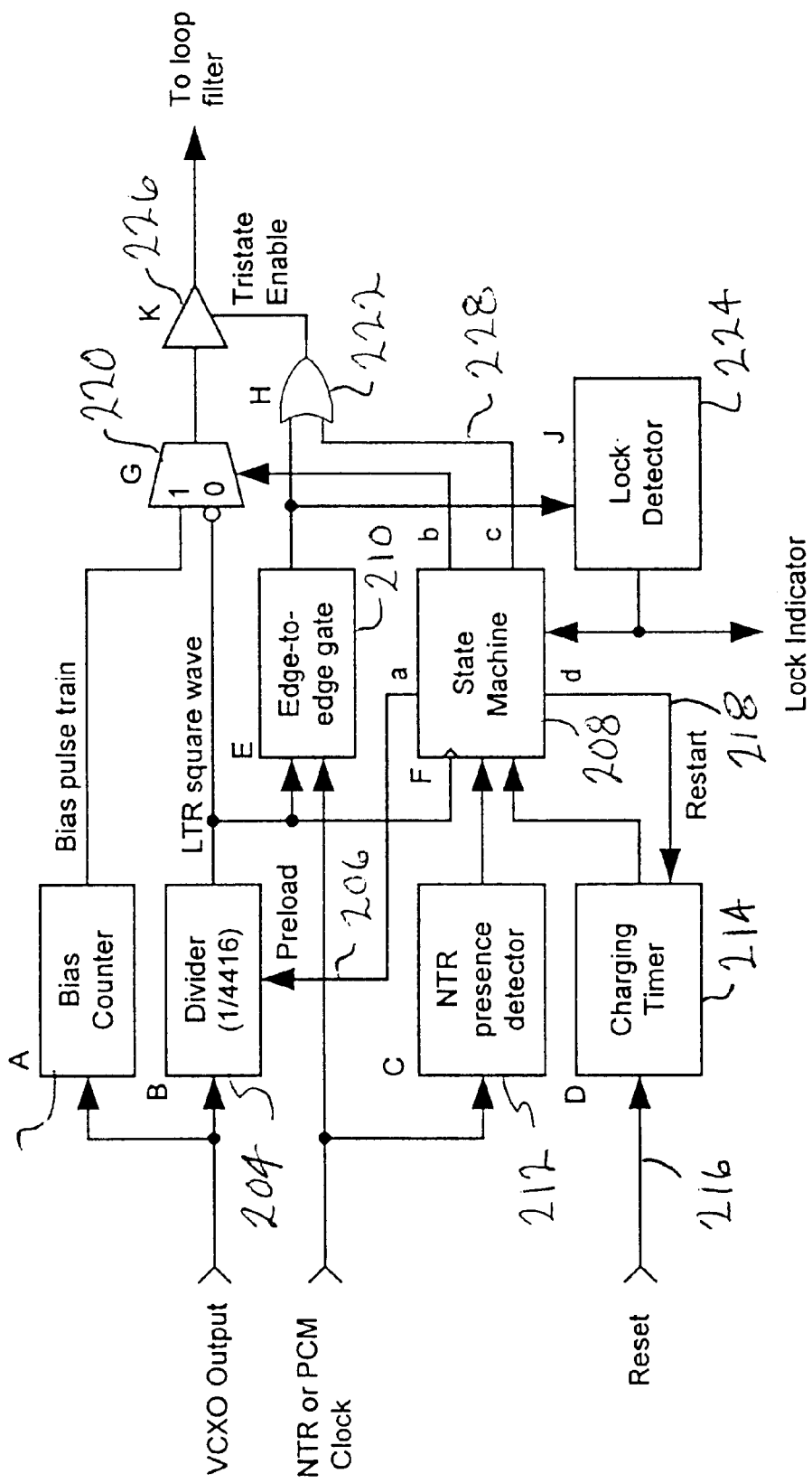
FIG. 2 is a simplified block diagram depicting one embodiment of PLD logic suitable for use with the PLL shown in FIG. 1.

FIG. 2 is a simplified block diagram depicting one embodiment of PLD logic 200 suitable for use with the PLL 100 shown in FIG. 1. The high speed clock from the VCXO 106 feeds two blocks: the Bias Counter 202 and the Divider 204. The function of the Bias Counter 202 is to generate a continuous pulse train that has a duty cycle that results in the approximate midrange control voltage 108 to the VCXO 106 when smoothed by the loop filter 104. The function of the Divider 204 is to generate the local timing reference (LTR) that matches the reference input frequency (NTR or PCM clock) 110 when the PLL 100 is locked. For the case of locking 35.328 MHz to 8 kHz, for example, the Divider 204 countdown factor is 4,416. The purpose of the Preload 206 control (output 'a' from the State Machine 208) is to reposition the positive edge of the LTR 110 to its approximate final delay following the positive edge of the NTR 110 in order to reduce the acquisition time.

The timing reference input (NTR) 110 feeds two blocks: the Edge-to-edge gate 210 and the NTR presence detector 212. The function of the Edge-to-edge gate 210 is to generate a pulse that begins with the positive edge of every NTR 110 pulse. The NTR presence detector 212 provides a steady true output when the NTR 110 signal is present.

The Charging Timer 214 provides a fixed time delay from either the Reset input 216 or a Restart signal ('d') 218 from the State Machine 208. The purpose of this time delay is to allow sufficient time for the loop filter to charge to the midrange control voltage before closing the loop.

The remaining blocks are seen to be the Multiplexer 220, the OR gate 222, the Lock Detector 224, and the tristate buffer 226. The Multiplexer 220 selects either the bias pulse train or the complemented LTR signal as the input to the tristate buffer 226, as controlled by the State Machine 208. The bias pulse train is selected during open-loop operation, which is when the NTR 110 signal is not present, as stated herein before, or during a loop filter 104 charging interval. In closed-loop operation, the complemented LTR signal is selected. The OR gate 222 allows the tristate buffer 226 to be enabled by either the variable period of the Edge-to-edge gate 210 or the fixed period determined by the State Machine 208 output ('c') 228. In open-loop operation, output 228 is a constant logic 1, so that the tristate buffer 226 is always enabled, and the output is the bias pulse train. In closed-loop operation, output 228 is a fixed-length pulse following every positive edge of the LTR signal. Since this is combined with the Edge-to edge gate 210 via OR gate 222, in closed loop operation the combined effect of the tristate buffer 226 and enable signals is to generate variable-length logic 1 pulses prior to each positive edge of the LTR signal, followed by fixed-length logic 0 pulses after each positive edge, with the output in tristate condition at all remaining times. This causes the LTR signal to lag the NTR 110 signal at an interval that creates the proper control voltage formed from the average of the combined duty cycle of the logic high and low pulses.

The Lock Detector 224 detects when the pulses from the Edge-to-edge gate 210 exceed a predetermined width, and interprets this as a loss of lock condition. This loss of lock condition forces the State Machine 208 back to a starting state as described herein below with reference to FIG. 3.

Figure 3:
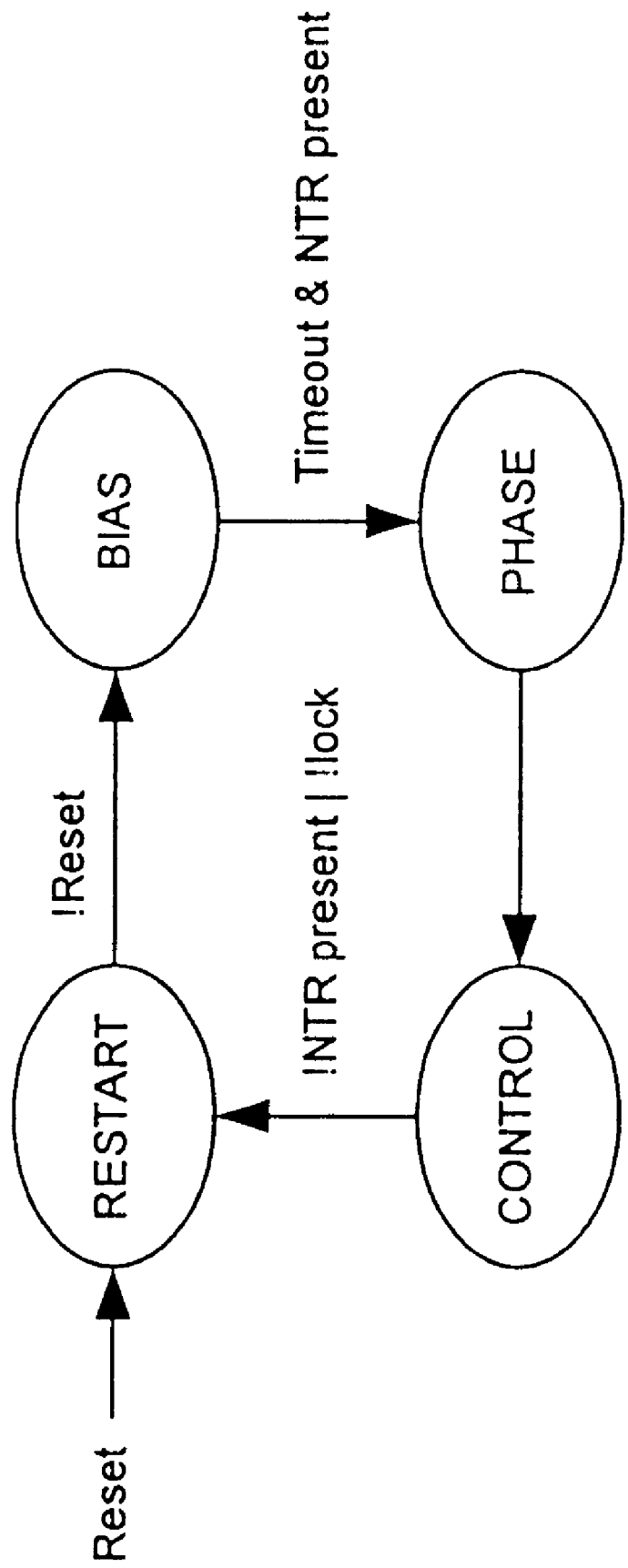
FIG. 3 is a PLD state machine diagram for the PLD logic shown in FIG. 2.

FIG. 3 is a PLD state machine diagram 300 for the PLD logic 200 shown in FIG. 2, and that is suitable to implement the PLD 102 shown in FIG. 1, according to one embodiment of the present invention. The PLD state machine diagram 300 is seen to have four states that are named RESTART, BIAS, PHASE, and CONTROL. These four states are described in Table 1 below. The states of the four control signals are shown, with a 1 always representing the active state.

TABLE 1

State Descriptions

| STATE | a | b | c | d | DESCRIPTION |
| --- | --- | --- | --- | --- | --- |
| RESTART | 0 | 1 | 1 | 1 | Restart the charging timer. Wait for removal of reset. |
| BIAS | 0 | 1 | 1 | 0 | Count LTR cycles to generate time delay. Select bias pulse train to output. Wait for timeout AND NTR presence detection. |
| PHASE | 1 | 0 | pulse | 0 | Select LTR pulse to output. Reposition LTR edge after NTR edge. |

TABLE 1-continued

State Descriptions

| STATE | a | b | c | d | DESCRIPTION |
|---|---|---|---|---|---|
| CONTROL | 0 | 0 | pulse | 0 | Allow variable/fixed pulses to control loop. Wait for loss of NTR or loss of lock. |

It is seen from the state diagram 300, that if the NTR 110 signal is not present, the logic remains in the BIAS state forever, and the PHASE state is only active for one cycle prior to the CONTROL state to establish a "starting" phase relationship between the NTR and LTR. When Preload control ('a') 206 is active, the Divider 204 is preloaded to a number near its maximum count on the positive edge of the NTR 110 signal. The effect of this state is to greatly reduce the phase capture. time. It is also seen with reference to Table 1 that in the PHASE and CONTROL states, State Machine control output ('c') 228 changes from a constant logic 1 to a fixed duty cycle pulse following every LTR positive edge.

The combination of digital logic with analog phase comparator techniques implemented herein provides advantages over conventional analog PLL implementations. Two advantages are the acceleration of frequency capture time and the acceleration of phase capture time. Frequency capture is accelerated by the rapid pre-charge of the loop filter 104 to a voltage near the optimum midrange voltage instead of waiting for the normal closed-loop operation to converge to this value. Phase capture is accelerated by rapid repositioning of the LTR positive edge to near its closed-loop position after the approximate frequency capture is performed. Both of these mechanisms are controlled by digital parameters rather than external component values. The final parameters are most preferably selected based on the midrange control voltage for the VCXO 106 used and on the logic 1 output voltage of the PLD 102.

Figure 4:
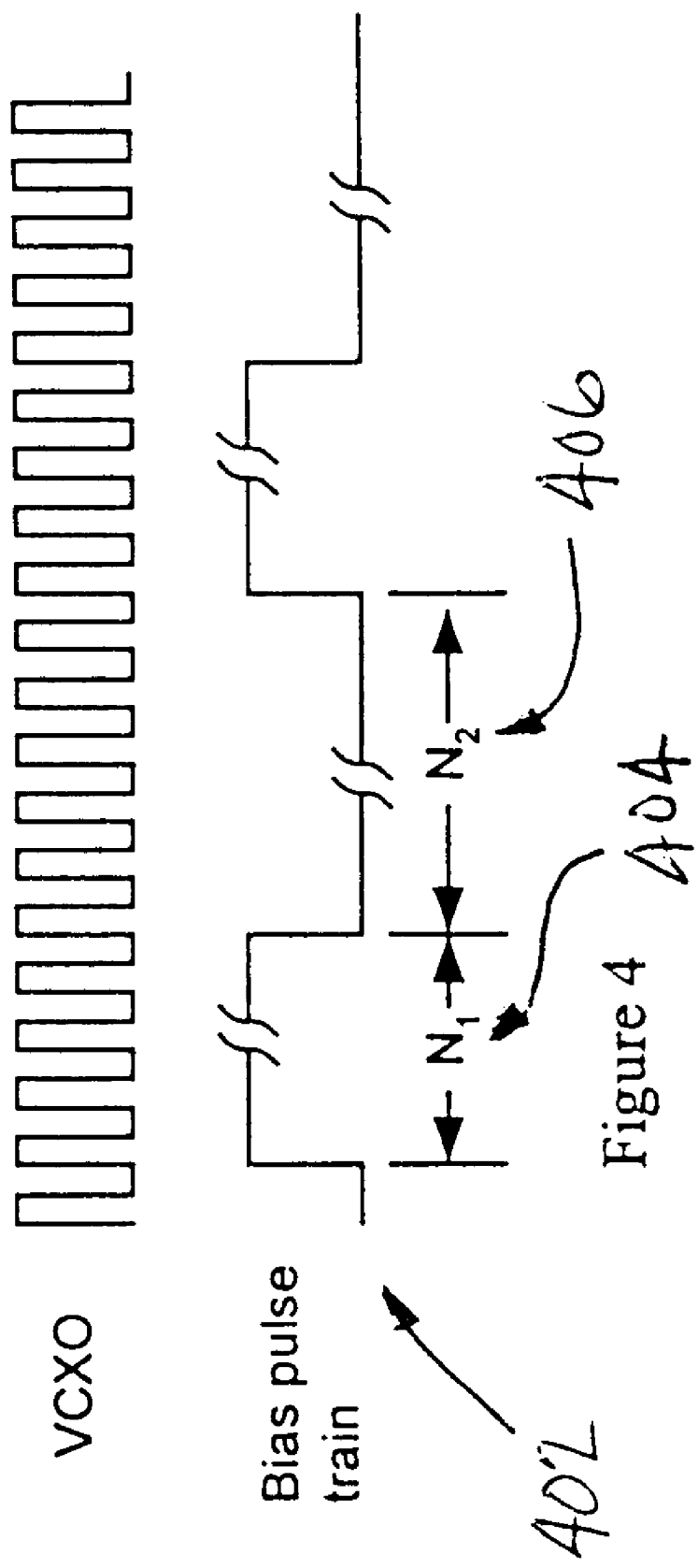
FIG. 4 is a generalized waveform diagram illustrating a bias pulse train waveform that is suitable to drive the PLL loop filter shown in FIG. 1 during open-loop operation (Bias State)

FIG. 4 is a generalized waveform diagram 400 illustrating a bias pulse train waveform 402 that is suitable to drive the PLL loop filter 104 shown in FIG. 1 during open-loop operation (Bias State). It can be appreciated that conceptually, the bias pulse train waveform 402 is formed by two counters including one that drives the logic 1 state while counting $N_1$ 404 clocks of the VCXO 106, and a second that drives the logic 0 state while counting $N_2$ 406 clocks. The ratio $N_1/N_2$ is most preferably chosen such that the product of the duty cycle and the logic voltages results in the control voltage required for mid-frequency operation of the VCXO 106. This ratio therefore, is dependent upon the actual logic high and low voltages of the PLD 102 and the actual mid-frequency control voltage of the VCXO 106. Further, the bias pulse train frequency is most preferably high enough to keep ripple on the control voltage, and hence jitter on the VCXO 106, to within acceptable limits. Acceptable jitter for DSL operation, for example, is on the order of 1 nanosecond (ns). For a VCXO with a +/−100 ppm control range, the allowable ripple works out to be about 80 millivolts peak-to-peak. The frequency required to keep the ripple within this limit is a function of the external components. For the PPL components shown in FIG. 1, and using an MK2731 VCXO and a 5v PLD manufactured by Altera of San Jose, Calif., the values $N_1=15$ and $N_2=17$ produce a control voltage very near the closed-loop control voltage of 1.149 volts with acceptable ripple.

Figure 5:
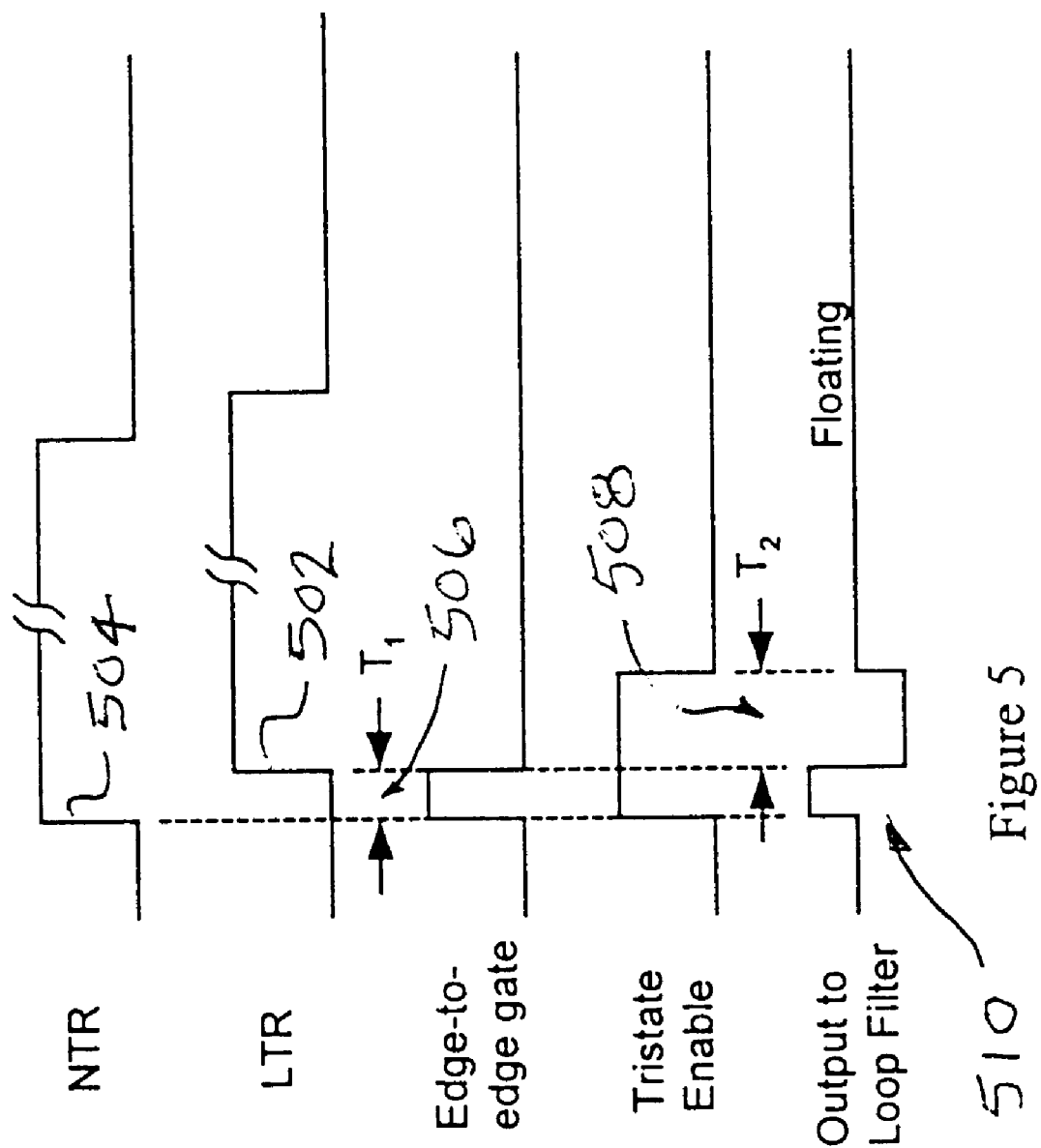
FIG. 5 depicts various PLD waveforms that may result when operating the PLL shown in FIG. 1 under closed-loop conditions (Control State)

FIG. 5 depicts various PLD waveforms 500 that may result when operating the PLL 100 shown in FIG. 1 under closed-loop conditions (Control State). The LTR positive edge 502 lags the NTR positive edge 504 by a delay $T_1$ 506, during which time the Edge-to-edge gate 210 produces a logic 1. Delay $T_1$ 506 is most preferably chosen to be just large enough so that with the maximum jitter on the NTR 110, the NTR positive edge 504 never occurs after the LTR positive edge 502. According to one embodiment, an NTR of 8 kHz sets delay $T_1$ 506 at approximately 600 ns. The tristate buffer 226 is enabled from the positive edge 504 of the NTR 110 until a fixed time $T_2$ 508 after the positive edge 502 of the LTR. During this interval 508, the output is driven from a logic 1 state during delay interval $T_1$ 506, to a logic 0 state during fixed time interval $T_2$ 508, and is floating the rest of the time. The result is the bipolar waveform 510. The loop forces $T_1$ 506 to the value such that the $T_1/T_2$ ratio produces the required control voltage through the loop filter 104.

Performance parameters of primary concern for a DSL application include self jitter, input jitter attenuation, and lock time. Also important is the ability to retain locked operation in the presence of a large amount of input jitter. As used herein, self jitter is the inherent jitter on the output of the VCXO 106 when locked to a perfect jitter-free NTR 110 or when operated open-loop. For the open-loop case, this is a combination of the absolute jitter of the VCXO 106 with a perfect d-c control voltage and the additional jitter caused by the ripple on the control voltage when driven by the bias pulse train 402. The present inventor found that for the ICS MicroClock MK2731 VCXO, the absolute jitter specified in its data sheet (200 ps) to be typical. As stated herein before, the jitter on the control voltage is most preferably selected to produce a total jitter on the order of 1 ns. For a perfectly locked PLL therefore, the only jitter source in addition to the VCXO inherent jitter would be that caused by the ripple in the control voltage caused by the pulse waveform 510 during interval $T_1$ 506 and $T_2$ 508. In view of the foregoing, it can be appreciated that keeping interval $T_1$ 506 and $T_2$ 508 small will minimize jitter. As discussed herein before with reference to closed-loop waveforms, interval $T_1$ 506 is made just large enough to allow for the maximum expected jitter on the NTR 110. The closed-loop self jitter can be reduced by increasing the values of C1 and C2 for the charge pump filter 104. According to one embodiment, the present inventor found DSL modem operation with the PLL 100 locked to a jitter-free 8 kHz NTR to be identical to that using a fixed oscillator.

As used herein, jitter attenuation means the ability of the PLL to attenuate any jitter present on the NTR input. The present inventor has found that ADSL modem performance is affected when the absolute jitter on the sample clock is greater than 2–3 nanoseconds at any frequency, but since jitter amplitude is inversely proportional to jitter frequency, it becomes increasingly important that the PLL attenuate low frequencies to the degree that they may be present. Jitter attenuation is affected by two important PLL characteristics: 1) the natural frequency of the PLL, and 2) the damping factor. For the present edge-to-edge type PLL 100 using a pulsed charge pump filter 104, the natural frequency $\omega_n$ is given by $$\omega_n \approx \sqrt{\frac{K_v \cdot I_c}{N \cdot C}}, \quad (1)$$

where $K_v$ is the VCXO 106 gain (MHz/Volt), $I_c$ is the charge pump 104 current (microamps), N is the total feedback divide factor, and C is the loop filter 104 capacitance (Farads). The present inventor found that for a 35.328 MHz VCXO 106 with a control gain of 100 ppm/volt, $K_v$ is approximately 0.0035. For the PLL 100 component values depicted in FIG. 1, the value of $I_c$ is approximately 2000 μA, N is 4416, and C is approximately 4.7×10$^{-6}$. Solving with these values yields $\omega_n$=18.5 rad/sec or approximately 3 Hz for the natural frequency. The PLL 100 is most sensitive to input jitter at this frequency, and may amplify the jitter depending upon the damping. The damping factor ç is given by $$\zeta \approx \frac{R}{2}\sqrt{\frac{K_v \cdot I_c \cdot C}{N}}, \qquad (2)$$

where R is the damping resistor (R2 in FIG. 1). For critical damping, ç is normally chosen as 0.7. This is the approximate value using the component values shown in FIG. 1. The damping resistor R2 has an adverse effect under certain conditions however, in that it reduces the attenuation at higher frequencies.

Figure 6:
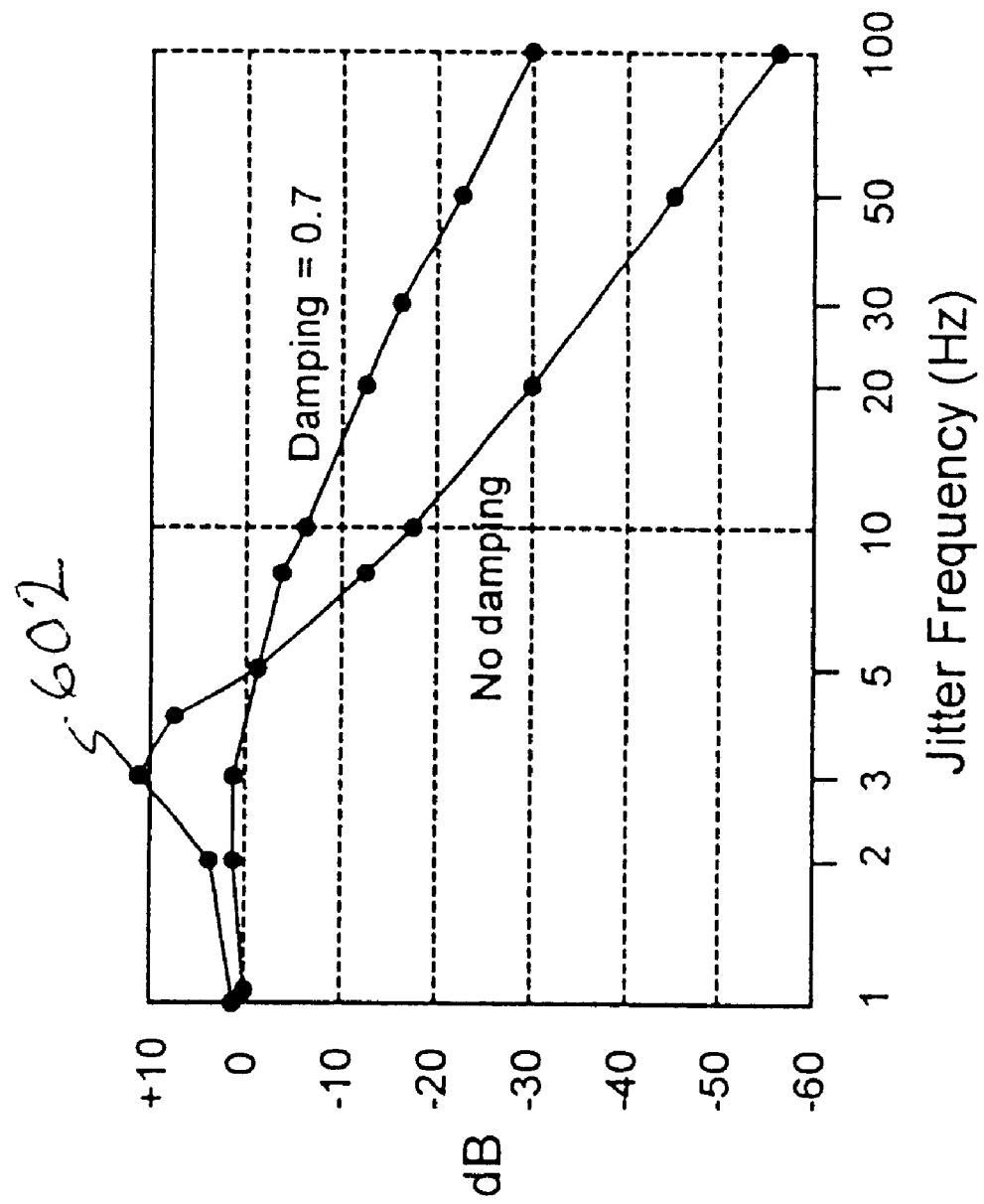
FIG. 6 is a diagram illustrating jitter attenuation of the PLL shown in FIG. 1 as a function of the jitter frequency on the NTR under damping and no damping conditions according to one embodiment of the present invention.

FIG. 6 is a diagram illustrating jitter attenuation 600 of the PLL 100 shown in FIG. 1 as a function of the jitter frequency on the NTR 110 under damping (R2 set at 15 kΩ) and no damping (R2 set to zero) conditions according to one embodiment of the present invention. It can be seen that without damping, the PLL 100 has a peak response 602 to input jitter at its natural frequency, where the jitter amplitude is amplified by about 10 dB. Above 5 Hz, however, the jitter is seen to be attenuated with a slope of 40 dB/decade. With damping, the low frequency attenuation is much improved, but above 5 Hz, attenuation approaches 20 dB/decade. A tradeoff between low frequency and high frequency attenuation can therefore be made by choosing the value of R2 based upon actual jitter characteristics of the reference frequency to be used.

As discussed herein before, the State Machine 208 in the PLL 100 attempts to shorten the lock time by a two-step process that includes: 1) approximate the frequency capture by rapidly charging the loop filter 104 to approximately the correct closed-loop voltage, and 2) approximate the phase capture by starting the edge of the LTR countdown at the approximate phase position of closed-loop operation. The lock time remaining is then the time required by the loop to correct for the errors in the approximations of these two steps. The present inventor has found that lock times of less than two seconds from power-on can easily be achieved by proper choice of these approximation parameters.

It can be appreciated that as with any PLL, the present PLL 100 will fail to lock if the absolute jitter on the reference exceeds an upper limit. This limit is set by the $T_1$ parameter 506 at about 1.2 μsec peak-to-peak, at which point the lock detector 224 shown in FIG. 2 forces the state machine back to the RESTART state as if the NTR 110 had been removed. The effect is to toggle rapidly between open and closed-loop operation. It can be appreciated that the closeness of the open-loop frequency and phase capture parameters to closed-loop operation will effect the resulting jitter, that under certain conditions, may be excessive for DSL clocking.

In summary explanation, a PLL 100 is described as a desirable alternative to other commercially available PLLs. One embodiment of the PLL 100 uses a voltage controlled crystal oscillator 106 driven by logic in a programmable logic device 102 or application specific integrated circuit for ADSL frequency locking applications. The present PLL architecture, for example, provides a considerable cost advantage over commercially packaged PLLs, particularly in clocked oscillator linecard applications where a PLD or FPGA is already required. Specifically, accessible digital timing parameters and analog filter components provide for flexible tuning of the PLL 100 in response to the jitter characteristics associated with a particular NTR or PCM clock source. Prior knowledge of the jitter characteristics of the NTR or whatever frequency reference is to be used is particularly beneficial, since several design parameters, both in the PLD logic and the external components, may depend upon knowledge of the jitter characteristics.

In view of the above, it can be seen the present invention presents a significant advancement in the art of phase-locked loops. Further, this invention has been described in considerable detail in order to provide those skilled in the data communication art with the information needed to apply the novel principles and to construct and use such specialized components as are required. In view of the foregoing descriptions, it should be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow.

What is claimed is:

1. A phase-locked loop (PLL) comprising:
   a voltage-controlled crystal oscillator (VCXO) operative to generate an output clock in response to a control voltage;
   a charge pump filter operative to generate the control voltage in response to first pulsed input signals during open-loop operation and second pulsed input signals during closed-loop operation;
   a logic device operative to generate the first pulsed input signals in response to the output clock and further operative to generate the second pulsed input signals in response to the output clock and an external timing reference clock; and
   the second pulsed input signals comprise logic high and low pulses generated in the vicinity of positive edges of the external timing reference clock to charge the charge pump filter to a voltage sufficient to achieve a desired frequency and phase lock and further comprise a tristate signal when logic pulses are not being generated.

2. A phase-locked loop (PLL) comprising:
   a voltage-controlled crystal oscillator (VCXO) operative to generate an output clock in response to a control voltage;
   a charge pump filter operative to generate the control voltage in response to first pulsed input signals during open-loop operation and second pulsed input signals during closed-loop operation;
   a logic device operative to generate the first pulsed input signals in response to the output clock and further operative to generate the second pulsed input signals in response to the output clock and an external timing reference clock; and
   the first pulsed input signals comprise logic pulses having a duty cycle sufficient to maintain the control voltage at a nominal mid-range control voltage level such that the VCXO will operate at its center frequency.

3. The phase-locked loop according to claim 2 wherein the logic device is selected from the group consisting of an application specific integrated circuit (ASIC) and a programmable logic device (PLD).

4. A phase-locked loop (PLL) comprising:
a voltage-controlled crystal oscillator (VCXO) operative to generate an output clock in response to a control voltage;
a charge pump filter operative to generate the control voltage in response to first pulsed input signals during open-loop operation and second pulsed input signals during closed-loop operation;
a logic device operative to generate the first pulsed input signals in response to the output clock and further operative to generate the second pulsed input signals in response to the output clock and an external timing reference clock; and
the logic device comprises a bias counter operative to generate the first pulsed input signals such that the first pulsed input signals comprise a continuous pulse train having a duty cycle sufficient to maintain the control voltage at a nominal mid-range control voltage level when smoothed via the charge pump filter.

5. The phase-locked loop according to claim 4 wherein the logic device further comprises a state machine operative to enable the bias counter to generate the first pulsed input signals solely in the absence of the external timing reference clock.

6. The phase-locked loop according to claim 4 wherein the logic device comprises a divider operative to generate a local timing reference (LTR) that matches the output clock when the PLL is locked.

7. A phase-locked loop (PLL) comprising:
a voltage-controlled crystal oscillator (VCXO) operative to generate an output clock in response to a control voltage;
a charge pump filter operative to generate the control voltage in response to first pulsed input signals during open-loop operation and second pulsed input signals during closed-loop operation;
a logic device operative to generate the first pulsed input signals in response to the output clock and further operative to generate the second pulsed input signals in response to the output clock and an external timing reference clock; and
the logic device comprises a divider operative to generate a local timing reference (LTR) that matches the output clock when the PLL is locked and the logic device further comprises a state machine operative in response to a positive edge of the external timing reference clock to enable the divider to reposition a positive edge of the LTR to its approximate final delay position such that PLL acquisition time can be reduced.

8. A phase-locked loop (PLL) comprising:
a voltage-controlled crystal oscillator (VCXO) operative to generate an output clock in response to a control voltage;
a charge pump filter operative to generate the control voltage in response to first pulsed input signals during open-loop operation and second pulsed input signals during closed-loop operation;
a logic device operative to generate the first pulsed input signals in response to the output clock and further operative to generate the second pulsed input signals in response to the output clock and an external timing reference clock; and the logic device comprises an edge-to-edge gate operative to enable generation of the second pulsed input signals as logic high and low pulses generated in the vicinity of positive edges of the external timing reference clock to charge the charge pump filter to a voltage sufficient to achieve a desired frequency and phase lock.

9. A phase-locked loop (PLL) comprising:
a voltage-controlled crystal oscillator (VCXO) operative to generate an output clock in response to a control voltage;
a charge pump filter operative to generate the control voltage in response to first pulsed input signals during open-loop operation and second pulsed input signals during closed-loop operation;
a logic device operative to generate the first pulsed input signals in response to the output clock and further operative to generate the second pulsed input signals in response to the output clock and an external timing reference clock; and the logic device comprises comprises a charging timer operative in response to at least one of a reset signal and a state machine restart signal to allow the charge pump filter to charge to a midrange control voltage level before the loop is closed.

10. A phase-locked loop (PLL) comprising:
a voltage-controlled crystal oscillator (VCXO) operative to generate an output clock in response to a control voltage;
a charge pump filter operative to generate the control voltage in response to first pulsed input signals during open-loop operation and second pulsed input signals during closed-loop operation;
a logic device operative to generate the first pulsed input signals in response to the output clock and further operative to generate the second pulsed input signals in response to the output clock and an external timing reference clock; and the logic device comprises a state machine operative to enable the logic device to generate the second pulsed input signals solely in the presence of the external timing reference clock and to generate the first pulsed input signals solely in the absence of the external timing reference clock.

11. A phase-locked loop (PLL) comprising:
a voltage-controlled crystal oscillator (VCXO) operative to generate an output clock in response to a control voltage;
a loop filter operative to generate the control voltage in response to first pulsed input signals during open-loop operation of the PLL and second pulsed input signals during closed-loop operation of the PLL; and
a logic device operative to generate the first pulsed input signals in response to the output clock and further operative to generate the second pulsed input signals in response to the output clock and an external timing reference clock, wherein the logic device comprises:
a bias counter operative in response to the output clock to generate the first pulsed input signals;
a divider operative in response to a state machine preload signal and the external timing reference clock to generate a local timing reference (LTR) that matches the output clock when the PLL is locked;
an edge-to-edge gate operative in response to the LTR and the external timing reference clock to generate a pulse width signal;
a lock detector operative to generate a lock detector signal in response to the pulse width signal;
an external timing reference clock presence detector operative to generate a presence signal in the presence of an external timing reference clock;

a charging timer operative to generate a reset output signal in response to a charging timer input signal selected from the group consisting of a reset input signal and a restart input signal; and a state machine responsive to the LTR, the presence signal, the reset output signal, and the lock detector signal to generate the state machine preload signal, the restart input signal, a bias signal, and a phase/control signal, wherein the state machine is operative to further enable the logic device to generate the first pulsed input signals in response to a first state of the bias signal and the second pulsed input signals in response to a second state of the bias signal, and further wherein the state machine is operative in response to the phase/control signal to further enable the logic device to selectively present a tristate output to the loop filter.

12. The phase-locked loop according to claim 11 wherein the logic device is selected from the group consisting of an application specific integrated circuit (ASIC) and a programmable logic device (PLD).

13. A method of controlling a phase-locked loop including a voltage controlled crystal oscillator, a loop filter, and a logic device, the method comprising the steps of:

a) designing the phase-locked loop such that the voltage controlled crystal oscillator generates an output clock in response to a control voltage, wherein the control voltage is determined by a first loop filter charging voltage and a second loop filter charging voltage;

b) generating the first loop filter charging voltage in the presence of an external timing reference signal and generating the second loop filter charging voltage in the absence of an external timing reference signal, and wherein the step of generating the first loop filter charging voltage and the second loop filter charging voltage comprises generating a logic device tristated pulsed output signal and presenting the tristated pulsed output signal to the loop filter; and c) generating a tristated pulsed output signal comprises the step of generating a first logic signal that toggles between a logic high state and a logic low state at a duty cycle that maintains the second loop filter charging voltage at a nominal mid-range value such that the voltage controlled crystal oscillator can operate near its center frequency.

14. The method according to claim 13 wherein the step of generating a tristated pulsed output signal further comprises the step of generating logic high pulses and logic low pulses in the vicinity of a positive edge of the external timing reference signal to keep the first loop filter charging voltage at a value sufficient to achieve frequency and phase lock between the oscillator clock and the external timing reference signal.

15. The method according to claim 14 wherein the step of generating a tristated pulsed output signal further comprises the step of generating a tristated output signal and presenting the tristated output signal to the loop filter during portions of the external timing reference signal in which logic high pulses and logic low pulses are not generated such that the loop filter maintains nearly a constant d-c voltage level.

16. A phase-locked loop (PLL) comprising:

a voltage-controlled crystal oscillator (VCXO) operative to generate an output clock in response to a control voltage;

means for generating the control voltage in response to first pulsed input signals during open-loop operation and second pulsed input signals during closed-loop operation;

means for generating the first pulsed input signals in response to the output clock and further operative to generate the second pulsed input signals in response to the output clock and an external timing reference signal;

the means for generating the first pulsed input signals and the second pulsed input signals comprises a logic device selected from the group consisting of an application specific integrated circuit and a programmable logic device; and the logic device comprises a state machine configured to control generation of the first and second pulsed input signals such that the first pulsed input signals toggle between a logic high state and a logic low state at a duty cycle that maintains the control voltage at a nominal mid-range value such that the VCXO can operate near its center frequency, and further such that the second pulsed input signals comprise logic high pulses and logic low pulses in the vicinity of a positive edge of the external timing reference signal to keep the control voltage at a value sufficient to achieve frequency and phase lock between the output clock and the external timing reference signal, and further such that a tristated output signal is presented to the VCXO during portions of the external timing reference signal in which the logic high pulses and logic low pulses are not generated such that the control voltage is maintained at nearly a constant d-c voltage level.

17. The phase-locked loop according to claim 16 wherein the means for generating the control voltage comprises a charge pump loop filter.

* * * * *